(12) United States Patent
Yonemoto

(10) Patent No.: US 8,272,913 B2
(45) Date of Patent: Sep. 25, 2012

(54) ORGANIC LIGHT-EMITTING DEVICE, AND METHOD FOR MANUFACTURING ORGANIC LIGHT-EMITTING DEVICE

(75) Inventor: Issei Yonemoto, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/782,257

(22) Filed: May 18, 2010

(65) Prior Publication Data

US 2010/0243156 A1    Sep. 30, 2010

Related U.S. Application Data

(62) Division of application No. 11/686,824, filed on Mar. 15, 2007, now abandoned.

(30) Foreign Application Priority Data

Mar. 23, 2006  (JP) .................................. 2006-080627
Mar. 7, 2007   (JP) .................................. 2007-056761

(51) Int. Cl.
*H01J 9/26* (2006.01)
(52) U.S. Cl. ......................................... 445/25; 313/512
(58) Field of Classification Search .................. 313/512; 445/25
See application file for complete search history.

(56) References Cited

U.S. PATENT DOCUMENTS

| | | | | |
|---|---|---|---|---|
| 5,194,027 A | | 3/1993 | Kruskopf et al. ............... 445/24 |
| 5,455,386 A | * | 10/1995 | Brathwaite et al. ........... 174/529 |
| 6,236,107 B1 | * | 5/2001 | Chan et al. ..................... 257/666 |
| 6,833,668 B1 | * | 12/2004 | Yamada et al. ................ 313/505 |
| 6,936,131 B2 | | 8/2005 | McCormick et al. .......... 156/292 |
| 2003/0039859 A1 | | 2/2003 | Ohata ............................ 428/690 |
| 2003/0062830 A1 | | 4/2003 | Guenther et al. ............. 313/512 |
| 2003/0173897 A1 | * | 9/2003 | Iwase et al. ................... 313/512 |
| 2004/0124768 A1 | * | 7/2004 | Suzuki et al. ................. 313/504 |
| 2004/0135499 A1 | | 7/2004 | Cok ............................... 313/506 |
| 2005/0230679 A1 | | 10/2005 | Yonemoto et al. ............. 257/40 |

FOREIGN PATENT DOCUMENTS

| | | |
|---|---|---|
| JP | 2000-208251 | 7/2000 |
| JP | 2002-124374 | 4/2002 |
| JP | 2003-272830 | 9/2003 |
| JP | 2004-234938 | 8/2004 |
| JP | 2005-216582 | 8/2005 |

* cited by examiner

*Primary Examiner* — Anh Mai
*Assistant Examiner* — Andrew Coughlin
(74) *Attorney, Agent, or Firm* — Fitzpatrick, Cella, Harper & Scinto

(57) ABSTRACT

The present invention provides an organic light-emitting device which can prevent a covering member from being damaged or peeled off, and which can be manufactured with excellent productivity and cost performance; and a method for manufacturing the organic light-emitting device. The covering member has a chamfer formed on the side of a face of the covering member on a reverse side to the side of an organic light-emitting element.

2 Claims, 4 Drawing Sheets

ORGANIC LIGHT-EMITTING DEVICE, AND METHOD FOR MANUFACTURING ORGANIC LIGHT-EMITTING DEVICE

CROSS REFERENCE TO RELATED APPLICATION

This application is a division of U.S. application Ser. No. 11/686,824, filed on Mar. 15, 2007, now abandoned, the disclosure of which is incorporated by reference herein in its entirety.

BACKGROUND OF THE INVENTION

1. Field of the Invention

The present invention relates to an organic light-emitting device having an organic light-emitting element covered with a covering member, and a method for manufacturing the organic light-emitting device.

2. Description of the Related Art

In a normal organic light-emitting device, an organic light-emitting element (organic electroluminescence element) is covered with a covering member such as glass, a metal, a resin and a polarizing plate, in order to prevent the organic light-emitting element from deteriorating affected by water or oxygen.

In the case of an organic electroluminescence element having a gel layer as an intermediate layer in the upper part, a technology is known which dampproofs the organic electroluminescence element, by placing an adhesive on a perimeter of a flat covering glass plate after bringing the flat covering glass plate as a covering member in close contact with and on the intermediate layer (U.S. Pat. No. 5,194,027).

Another technology is known which double-dampproofs an organic electroluminescence element with the use of a hollow structure obtained by etching a glass sealing plate, applying an adhesive onto the back face, bonding the above described glass sealing plate as a covering member to a substrate to seal the inner part, and then placing an adhesive again at the joined perimeter of the glass sealing plate (Japanese Patent Application Laid-Open No. 2000-208251). Further, an organic electroluminescence panel is known in which a notch with a chamfered corner is formed on a sealing glass plate for sealing the organic electroluminescence element so as not to damage a flexible wiring board to be placed thereon (Japanese Patent Application Laid-Open No. 2004-234938).

Organic electroluminescence display devices according to U.S. Pat. No. 5,194,027 and Japanese Patent Application Laid-Open No. 2000-208251 have a problem that a perimeter of the covering member is damaged or partially peeled off from a periphery thereof by a large external peeling force that acts on a corner of the covering member, which is caused by a water pressure in a cleaning step or a physical impact force after an organic electroluminescence element is covered with the covering member.

Furthermore, in a step of placing an adhesive on a perimeter of a covering member, an appropriate very small amount of the adhesive must be placed at a correct position to bond and fix the covering member to the substrate. For example, the organic electroluminescence display devices also have a problem that the step of applying a large amount of the adhesive to the perimeter of the covering member and then removing an excessive adhesive with a squeegee leads to a high material cost and a high apparatus cost.

When applying an adhesive to a perimeter of a covering member with a high accuracy by using a dispenser, it is necessary, for instance, to set a dispenser needle diagonally to the perimeter so that the dispenser needle may not contact with the covering member. Consequently the organic electroluminescence display devices further have a problem that a robot-moving mechanism becomes complicated in order to adjust an angle of the dispenser needle and rotate the dispenser needle, whereby an apparatus cost increases.

SUMMARY OF THE INVENTION

The present invention provides an organic light-emitting device which can prevent damage, peeling-off, and the like of a covering member, and which can be manufactured with excellent productivity and cost performance; and a method of manufacturing the organic light-emitting device.

In order to solve the above-described problems of the prior art, the present invention provides a method of manufacturing an organic light-emitting device which includes a substrate; an organic light-emitting element arranged on the substrate and including a pair of electrodes and an organic compound layer formed between the pair of the electrodes; a covering member arranged on the organic light-emitting element, for covering the organic light-emitting element; and an adhesive member for adhering an end of the covering member and an end of the substrate, the method including: a step of arranging, on the organic light-emitting element, the covering member having a chamfer formed on a side of one face thereof so that a face of the covering member on a reverse side to the one face faces to a side of the organic light-emitting element; and a step of adhering a side part of the covering member and a face of the substrate on a side of the covering member by dripping the adhesive member to the chamfer from above the face.

An organic light-emitting device according to the present invention includes: a substrate; an organic light-emitting element formed on the substrate, and including a pair of electrodes and an organic compound layer formed between the pair of the electrodes; a covering member arranged on the organic light-emitting element, for covering the organic light-emitting element, the covering member having a chamfer formed on a side of a face thereof on a reverse side to the organic light-emitting element; and an adhesive member for adhering the substrate and the covering member by adhering a side part of the covering member and a face of the substrate on a side of the covering member.

In a method of manufacturing an organic light-emitting device according to the present invention, the chamfer is formed on the end of the top face of a covering member. Therefore, the manufactured organic light-emitting device can prevent damage, peeling-off, and the like of the covering member because even when the covering member receives a water pressure in a cleaning step and a physical impact force after an organic light-emitting element has been covered with the covering member, the water pressure and the physical impact force do not act on the covering member as an external peeling force.

In addition, the covering member can be placed on an intended position because the adhesive member attached to the chamfer naturally flows down toward the substrate only by covering the organic light-emitting element with the covering member and dripping the adhesive member on the chamfer formed on the side of a face of the covering member on a reverse side to the organic light-emitting element. Accordingly, the manufacturing method shows excellent productivity and cost performance because the method enables the organic light-emitting element to be easily and reliably covered with the covering member without using a high-precision dispenser device for an operation of covering the organic light-emitting element and without removing an excessive adhesive member by a squeegee.

Further features of the present invention will become apparent from the following description of exemplary embodiments with reference to the attached drawings.

DESCRIPTION OF THE EMBODIMENTS

The best mode of an organic light-emitting device and a method for manufacturing the organic light-emitting device according to the present invention will be now described with reference to the accompanying drawings.

(Embodiment 1)

Figure 1A:
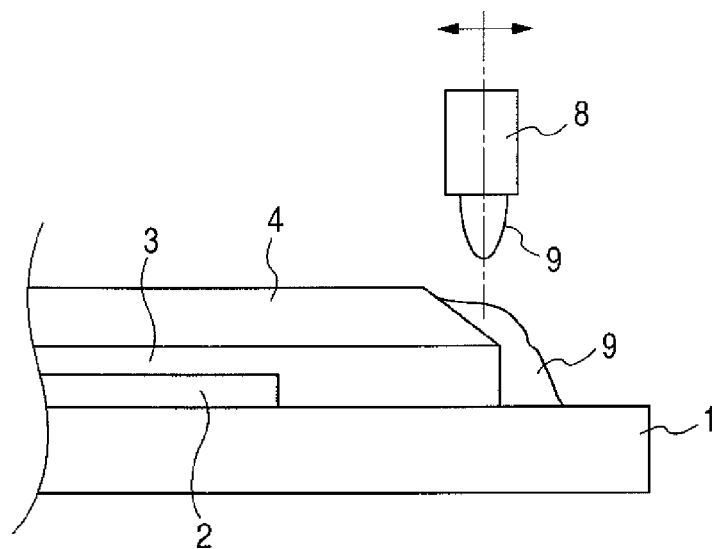
FIG. 1A is a schematic cross-sectional view illustrating an organic light-emitting device and a method of manufacturing the organic light-emitting device, in Embodiment 1 (Example 1) according to the present invention.
Figure 1B:
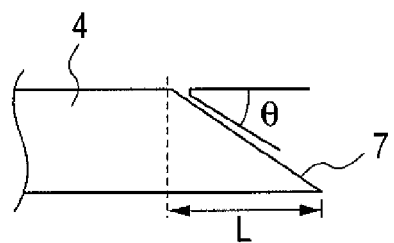
FIG. 1B is an enlarged view of a chamfer.
Figure 1C:
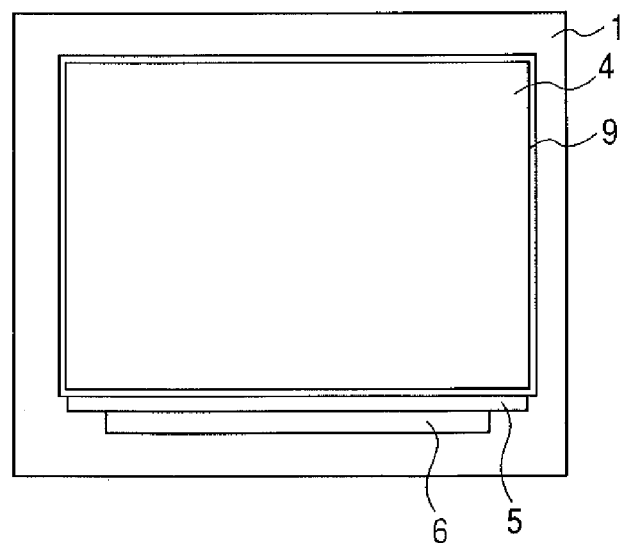
FIG. 1C is a plan view of FIG. 1A.

FIG. 1A is a schematic cross-sectional view illustrating an organic light-emitting device and a method of manufacturing the organic light-emitting device, in Embodiment 1 according to the present invention. FIG. 1B is an enlarged view of a chamfer. FIG. 1C is a plan view of FIG. 1A.

An organic light-emitting device shown in FIGS. 1A to 1C has an organic light-emitting element (organic electroluminescence element) 2, an intermediate layer 3 which is formed so as to cover the organic light-emitting element 2, and a covering member (flat glass plate) 4 which is formed on the upper face of the intermediate layer 3 as a so-called sealing plate, sequentially aligned and fixed on the upper face of a substrate 1 such as a glass plate. Incidentally, the organic light-emitting element 2 has a structure having a first electrode (not shown), an organic compound layer (not shown) and a second electrode (not shown). The organic light-emitting device has an insulation layer 5 and a drawing wiring 6 as shown in FIG. 1C, in other words, has a structure fundamentally similar to a conventional organic light-emitting device.

The covering member 4 is made from glass, a resin, a metal or the like, and has a chamfer 7 formed on a side of a face (end of upper face) of the covering member 4 on a reverse side to the organic light-emitting element (cf. FIG. 1B). The covering member 4 receives a water pressure at the time of shower cleaning or jet cleaning in a cleaning step after covering the organic light-emitting element 2 with the covering member, and normally the water pressure acts on the corner of the covering member as an external peeling force for peeling the covering member 4. However, the covering member 4 according to the present invention does not receive the external peeling force because of the shape effect of a chamfer 7 formed on an end of the upper face, and can prevent itself from being damaged and peeled off.

When a covering member 4 is made of glass, a chamfer 7 is formed by using a total mold grind stone in the step of cutting the covering member 4 into a predetermined shape, or by polishing an end thereof after having cut a glass plate (not shown). When the covering member 4 is made of a resin, it is easily formed into a mold shape by using a molding technique (not shown). The chamfer 7 can have a chamfered angle θ in a range of 30 to 60 degrees. Alternatively, when the chamfer 7 has a round shape, an effect in the present invention can be expected in particular. However, the chamfer 7 can have the shape with the angle θ of 45 degrees because the shape can be economically formed, and the effect of the present invention is obtained.

A normal dispenser device (not shown) has an XYZ shaft robot (not shown) for controlling a position of a dispenser needle 8, and the position accuracy is about ±0.2 mm. Accordingly, when a chamfered length (L) of a chamfer 7 on a covering member 4, which indicates the horizontal length of a chamfered portion of the cover member as shown in FIG. 1B, is set to 0.2 mm or more, an adhesive member 9 as a sealing agent ejected from the vertically downward-directing dispenser needle 8 can be dripped on a chamfer 7 even when the center position of ejection of the dispenser is deviated from the intended position. In other words, the dispenser device can reliably drop the adhesive member 9 onto the chamfer 7 of the covering member 4 within an accuracy of the XYZ shaft robot itself. Incidentally, the dispenser device goes around a perimeter of the covering member 4 on a substrate 1 while the position is controlled by the XYZ shaft robot, and the ejecting step of the dispenser needle 8 is completed.

An adhesive member 9 dropped on a chamfer 7 flows down along the slope of the chamfer 7, is placed at an intended position (namely perimeters of intermediate layer 3 and covering member 4), covers the upper face of a substrate 1 and the border between the intermediate layer 3 and the covering member 4, and simultaneously adheres the covering member 4 and the substrate 1. As a result, an organic light-emitting element 2 is sealed at the perimeters by the covering member 4 and the adhesive member 9 so as not cause leakage (cf. FIG. 1C). Here, the adhesive member 9 can be such a material as to easily flow down on the chamfer 7 of the covering member 4 and be quickly hardened without giving damage to the organic light-emitting element 2 after having been placed at the intended position. The adhesive member 9 can be an epoxy resin having a viscosity, for instance, of 40,000±10,000 (mPa·s).

As described above, an adhesive member 9 can be placed at an intended position merely by covering an organic light-emitting element 2 with a covering member, and applying the adhesive member 9 onto the chamfer 7 which has been formed on a side of a face (end of a upper face) of the covering member 4 on a reverse side to the organic light-emitting element side. Accordingly, the above-described method shows excellent productivity and cost performance, because the method enables the organic light-emitting element 2 to be easily and reliably covered with the covering member, without using a high-precision dispenser device for an operation of covering the organic light-emitting element 2 or without removing an excessive adhesive member by a squeegee.

(Embodiment 2)

Figure 2:
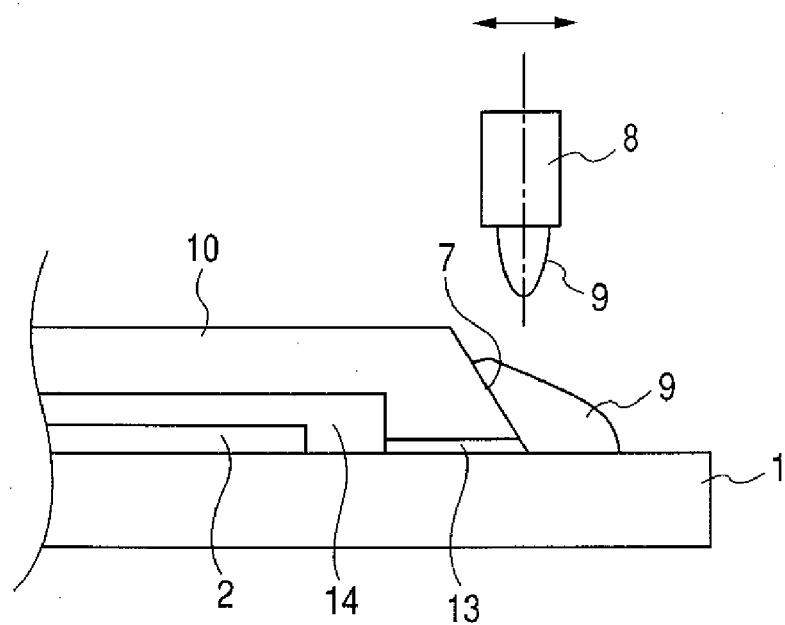
FIG. 2 is a schematic cross-sectional view illustrating an organic light-emitting device and a method for manufacturing the organic light-emitting device, in Embodiment 2 (Example 2) according to the present invention.

FIG. 2 is a schematic cross-sectional view illustrating an organic light-emitting device and the method of manufacturing the organic light-emitting device, in Embodiment 2 according to the present invention.

An organic light-emitting device shown in FIG. 2 has an organic light-emitting element 2 which is covered with a covering member 10 made of an etched covering glass plate. The lower face side of the glass plate is etched except the outer edge. On the other hand, a chamfer 7 is formed on an end of the upper face reverse to the etched face. Accordingly, the covering member 10 does not receive a peeling force by the shape effect, and can prevent itself from being damaged and peeled off.

In addition, an adhesive member 9 as a sealing agent can be placed at an intended position by dripping on the chamfer 7 the adhesive member ejected from a vertically downward-directing dispenser needle 8, and allowing the adhesive member 9 dripped on the chamfer 7 to flow down along a slope of the chamfer 7, even when the center position of ejection of the dispenser is deviated from the intended position. Accordingly, the organic light-emitting device can be manufactured with excellent productivity and cost performance, because the organic light-emitting element 2 can be easily and reliably covered with a covering member, without using a high-precision dispenser device for an operation of covering the organic light-emitting element 2 or without removing an excessive adhesive member by a squeegee.

(Embodiment 3)

Figure 3:
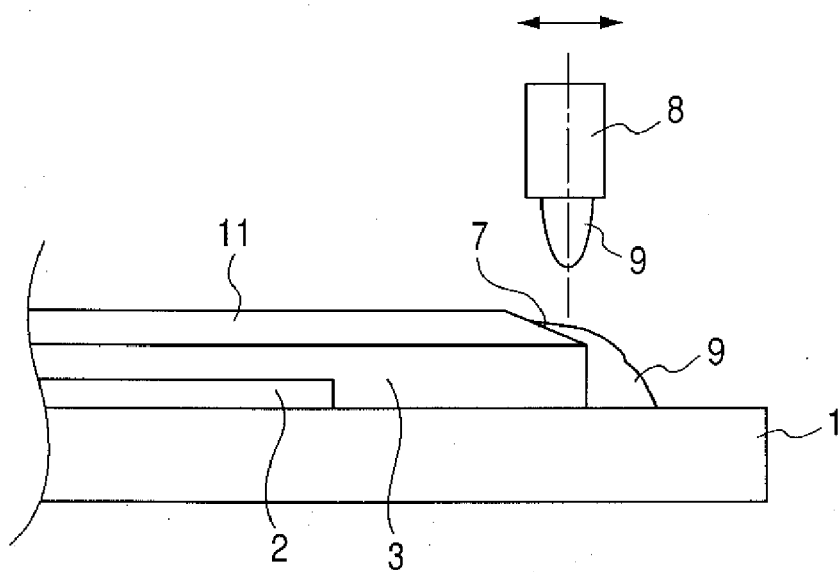
FIG. 3 is a schematic cross-sectional view illustrating an organic light-emitting device and a method for manufacturing the organic light-emitting device, in Embodiment 3 (Example 3) according to the present invention.

FIG. 3 is a schematic cross-sectional view illustrating an organic light-emitting device and the method of manufacturing the organic light-emitting device, in Embodiment 3 according to the present invention.

An organic light-emitting device shown in FIG. 3 has an organic light-emitting element 2 covered with a covering member 11 formed of a polarizing plate made of a PVA resin, and a chamfer 7 is formed on an end of the upper face of the covering member 11. Therefore, the covering member 11 also does not receive an external peeling force by the shape effect, and can prevent itself from being damaged and peeled off.

In addition, an adhesive member 9 as a sealing agent can be placed at an intended position by dripping the adhesive member ejected from a vertically downward-directing dispenser needle 8 on the chamfer 7, and allowing the adhesive member 9 dripped on the chamfer 7 to flow down along a slope of the chamfer 7 even when the center position of ejection of the dispenser is deviated from the intended position. Accordingly, the organic light-emitting device can be manufactured with excellent productivity and cost performance, because the organic light-emitting element 2 can be easily and reliably covered with a covering member, without using a high-precision dispenser device in an operation of covering the organic light-emitting element 2 or without removing an excessive adhesive member by a squeegee.

(Embodiment 4)

Figure 4:
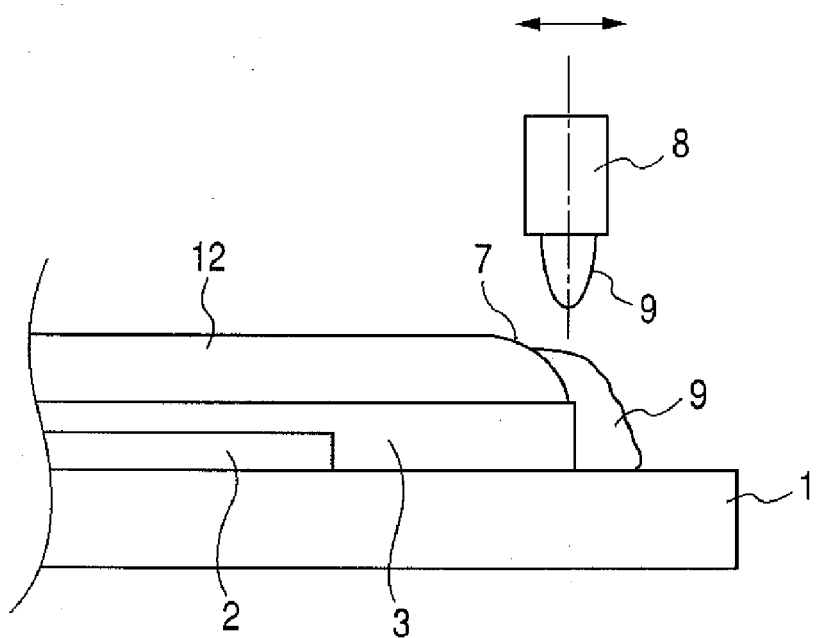
FIG. 4 is a schematic cross-sectional view illustrating an organic light-emitting device and a method for manufacturing the organic light-emitting device, in Embodiment 4 (Example 4) according to the present invention.

FIG. 4 is a schematic cross-sectional view illustrating an organic light-emitting device and the method of manufacturing the organic light-emitting device, in Embodiment 4 according to the present invention.

An organic light-emitting device shown in FIG. 4 has an organic light-emitting element 2 covered with a covering member 12 formed of a flat covering glass plate, and a rounded chamfer 7 is formed on an end of the upper face of the covering member 12. Therefore, the covering member 12 also does not receive an external peeling force by the shape effect, and can prevent itself from being damaged and peeled off.

In addition, an adhesive member 9 as a sealing agent can be placed at an intended position by dripping the adhesive member ejected from a vertically downward-directing dispenser needle 8 on the chamfer 7, and allowing the adhesive member 9 dripped on the chamfer 7 to flow down along a slope of the chamfer 7 even when the center position of ejection of the dispenser is deviated from the intended position. Accordingly, the organic light-emitting device can be manufactured with excellent productivity and cost performance, because the organic light-emitting element 2 can be easily and reliably covered with a covering member, without using a high-precision dispenser device in an operation of covering the organic light-emitting element 2 or without removing an excessive adhesive member by a squeegee.

Incidentally, the above-described embodiments show one mode of the present invention and the present invention is not limited thereto. Specifically, a covering member 4 is expressed as a protective member in other words, and the material also can be widely selected. It is possible to employ a form in which a polarizing plate having a chamfer is further adhered as the covering member onto the upper face of a covering glass plate provided with the chamfer (not shown), and furthermore, an adhesive member may not be applied to the periphery of the polarizing plate having the chamfer (not shown).

In the above-described embodiments, an adhesive member 9 is continuously placed on all perimeters, namely, on four peripheral sides of the covering member as a so-called sealing agent, but the adhesive member 9 may also be partially placed at the perimeter of the covering member only for the purpose of adhering the covering member to a substrate.

EXAMPLE 1

A covering member 4 employed in the present example was formed of a flat covering glass plate with a size of 35 mm×40 mm and a thickness of 0.6 mm, and had a chamfer 7 with a chamfered length of 0.6 mm and a chamfered angle of 45 degrees formed on an end of the top face of the covering member 4 (cf. FIG. 1).

A step of covering an organic light-emitting element will be now described below. The organic light-emitting element 2, an intermediate layer 3 and a covering member 4 were sequentially aligned and fixed on a substrate 1 with a size of 40 mm×50 mm and a thickness of 0.6 mm. Subsequently, the adhesive member 9 was ejected to all the perimeters of the above-described covering member 4 by a dispenser needle 8. The adhesive member 9 which had been dripped on a chamfer 7 of the covering member 4 flowed downward and was placed at the perimeters of the intermediate layer 3 and the covering member 4 with high accuracy.

EXAMPLE 2

A covering member 10 employed in the present example was formed of an etched covering glass plate with a size of 35 mm×40 mm and a thickness of 1.0 mm (cf. FIG. 2). A bottom side of the covering member 10 was etched in a depth of 0.4 mm except for a frame (base to be adhered) with the width of 1 mm prepared in the perimeter. On the other hand, a chamfer 7 with a chamfered angle of 45 degrees was formed on an end of the upper face reverse to the etched face.

A step of covering an organic light-emitting element will be now described below. The organic light-emitting element 2 was formed on a substrate 1 with a size of 40 mm×50 mm and a thickness of 0.6 mm. Subsequently, a sealing material 13 was ejected to a position on which a base to be adhered of a covering member 10 was placed on the substrate 1, by a normal dispenser device (not shown) having a position accuracy of ±0.2 mm. The covering member was then aligned on the above-described substrate 1, closely contacted with it, and adhered to the substrate 1 by the sandwiched sealing material 13. Subsequently, an adhesive member 9 was ejected to all the perimeters of the covering member 10 on the substrate 1 by a dispenser needle 8, similarly to the case of Example 1. The adhesive member 9 which had been dripped on a chamfer 7 of the covering member 10 flowed downward, and was placed at a perimeter of the covering member 10 with high accuracy. At the same time, a sealed space 14 was formed.

EXAMPLE 3

A covering member 11 employed in the present example was formed of a polarizing plate made from a PVA resin with a size of 35 mm×40 mm and a thickness of 0.3 mm, and had a chamfer 7 with a chamfered angle of 45 degrees formed on an end of the upper face (cf. FIG. 3).

A step of covering an organic light-emitting element will be now described below. The organic light-emitting element 2, an intermediate layer 3 and a covering member 11 were sequentially aligned and fixed on a substrate 1 with a size of 40 mm×50 mm and a thickness of 0.6 mm. Subsequently, an adhesive member 9 was ejected to all the perimeters of the above-described covering member by a dispenser needle 8, similarly to the case of Example 1. The adhesive member 9 which had been dripped on a chamfer 7 of the covering member 11 flowed downward and was placed at the perimeters of the intermediate layer 3 and the covering member 11 with high accuracy.

EXAMPLE 4

A covering member 12 employed in the present example was formed of a flat covering glass plate with a size of 35 mm×40 mm and a thickness of 0.6 mm, and had roundness (chamfer) 7 with a curvature of R1 made by a chamfering operation formed on the upper part (cf. FIG. 4).

A step of covering an organic light-emitting element will be now described below. The organic light-emitting element 2, an intermediate layer 3 and a covering member 12 were sequentially aligned and fixed on a substrate 1 with a size of 40 mm×50 mm and thickness of 0.6 mm. Subsequently, an adhesive member 9 was ejected to all the perimeters of the above-described covering member by a dispenser needle 8, similarly to the case of Example 1. The adhesive member 9 which had been dripped on a chamfer 7 of the covering member 12 flowed downward and was placed at the perimeters of the intermediate layer 3 and the covering member 12 with high accuracy.

COMPARATIVE EXAMPLE 1

Figure 5:
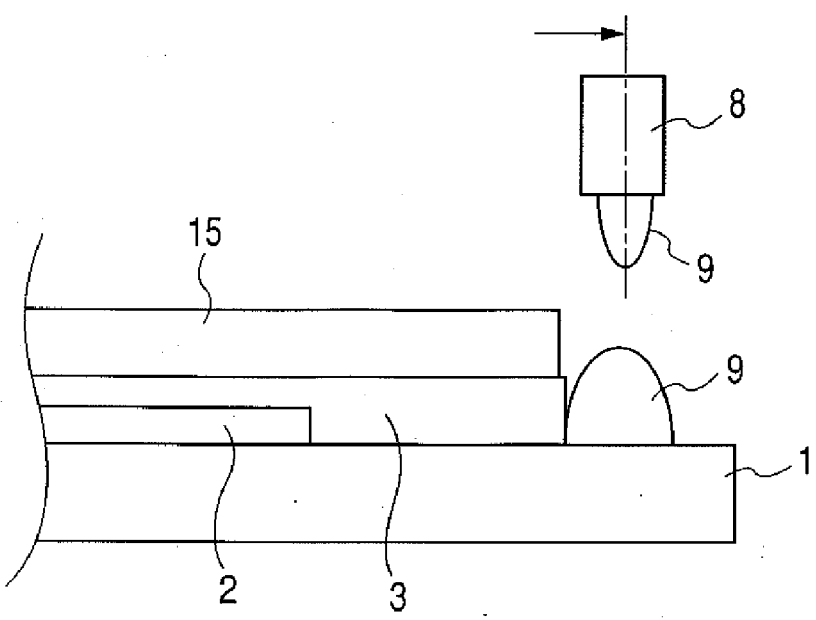
FIG. 5 is a schematic cross-sectional view illustrating a conventional organic light-emitting device and a conventional method for manufacturing the organic light-emitting device.

A covering member 15 employed in the present comparative example was formed of a flat covering glass plate having a size of 35 mm×40 mm and a thickness of 0.6 mm and having no chamfer thereon (cf. FIG. 5).

A step of covering an organic light-emitting element will be now described below. The organic light-emitting element 2, an intermediate layer 3 and a covering member 15 were sequentially aligned and fixed on a substrate 1 with a size of 40 mm×50 mm and a thickness of 0.6 mm. Subsequently, an adhesive member 9 was ejected to all perimeters of the covering member 15 by a dispenser needle 8, similarly to the case of Example 1. The adhesive member 9 was placed at a position outwardly greatly deviated from an intended position because the center position of the adhesive member 9 applied by the dispenser needle 8 was outwardly deviated from the intended position by 0.2 mm. Accordingly, the organic light-emitting element 2 could not be sealed by the adhesive member 9 and the covering member 15, and besides, the covering member 15 could not be adhered to the substrate 1.

COMPARATIVE EXAMPLE 2

Figure 6:
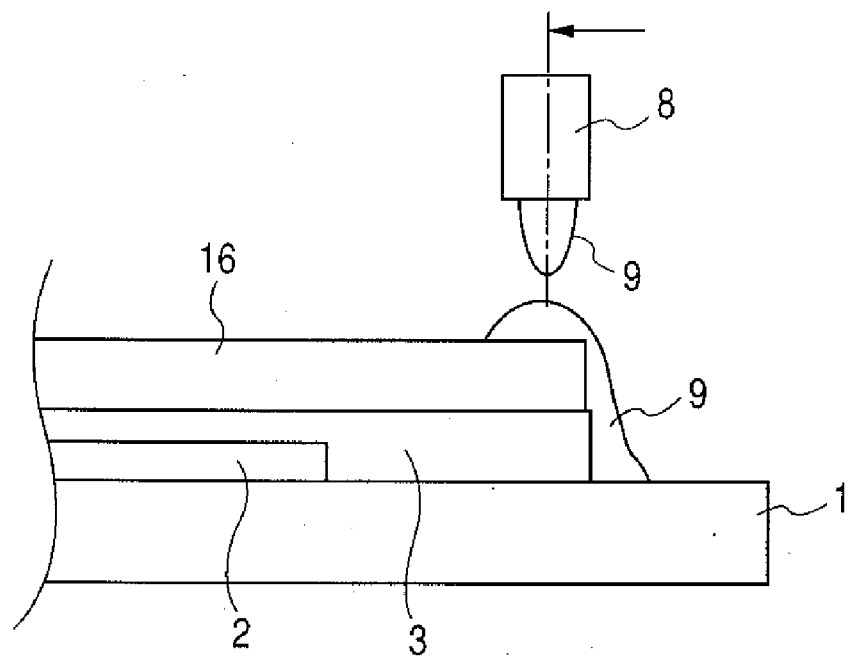
FIG. 6 is a schematic cross-sectional view illustrating a conventional organic light-emitting device and a conventional method for manufacturing the organic light-emitting device.

A covering member 16 employed in the present comparative example was also formed of a flat covering glass plate having a size of 35 mm×40 mm and a thickness of 0.6 mm thick and having no chamfer thereon (cf. FIG. 6).

A step of covering an organic light-emitting element will be now described below. The organic light-emitting element 2, an intermediate layer 3 and a covering member 16 were sequentially aligned and fixed on a substrate 1 with a size of 40 mm×50 mm and a thickness of 0.6 mm. Subsequently, an adhesive member 9 was ejected to all the perimeters of the covering member 16 by a dispenser needle 8, similarly to the case of Example 1. The adhesive member 9 was placed on the upper face of the covering member 16, which is inwardly greatly deviated from an intended position, and showed an inadequate shape, because the center position of the adhesive member 9 applied by the dispenser needle 8 was inwardly deviated from the intended position by 0.2 mm.

COMPARATIVE EXAMPLE 3

Figure 7:
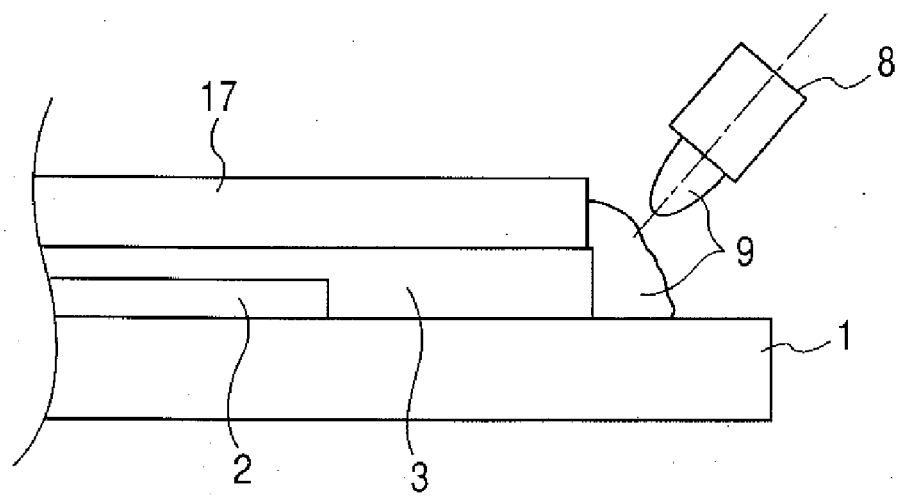
FIG. 7 is a schematic cross-sectional view illustrating a conventional organic light-emitting device and a conventional method for manufacturing the organic light-emitting device.

A covering member 17 employed in the present comparative example was also formed of a flat covering glass plate having a size of 35 mm×40 mm and a thickness of 0.6 mm and having no chamfer thereon (cf. FIG. 7).

A step of covering an organic light-emitting element will be now described below. The organic light-emitting element 2, an intermediate layer 3 and a covering member 17 were sequentially aligned and fixed on a substrate 1 with a size of 40 mm×50 mm and a thickness of 0.6 mm. Subsequently, a dispenser needle 8 was set so as to form an angle of 45 degrees with respect to the perimeter of the covering member 17, and an adhesive member 9 was ejected to all the perimeters by the dispenser needle 8. In addition, a position of a dispenser device was controlled by a high-function robot provided with XYZ shafts and even a rotatable shaft (not shown), and the adhesive member 9 was ejected to all the perimeter of the covering member 17 on a substrate 1 by a dispenser needle 8 while the formed angle of the dispenser needle 8 was kept at 45 degrees. The organic light-emitting element 2 could be sealed by the covering member 17 and the adhesive member 9 so as not to cause leakage, and furthermore, the covering member 17 could be adhered to the substrate 1 so that the adhesive member 9 might not mount on the upper face of the covering member 17. However, this step needed the expensive high-function robot for controlling such a dispenser device as described above and caused increase in a cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Laid-Open No. 2006-080627, filed Mar. 23, 2006, and 2007-

056761, filed Mar. 7, 2007 which are hereby incorporated by reference herein in their entirety.

What is claimed is:

1. A method of manufacturing an organic light-emitting device which includes a substrate; an organic light-emitting element arranged on the substrate, the organic light-emitting element comprising a pair of electrodes and an organic compound layer formed between the pair of the electrodes; a sealing plate arranged on the organic light-emitting element, for covering the organic light-emitting element; and an adhesive member for adhering the sealing plate and the substrate, the method comprising the steps of:

arranging, on the organic light-emitting element, the sealing plate having a peripheral wall having a chamfer formed on a side of the sealing plate that is opposite to a side of the sealing plate that faces the organic light-emitting element and a thickness of the sealing plate is thinner at an end portion of the sealing plate; and adhering the peripheral wall of the sealing plate and a periphery of the substrate with the adhesive member which is dripped to the chamfer using a dispenser, wherein the chamfer has a chamfered length of 0.2 mm or more.

2. The method for manufacturing the organic light-emitting device according to claim 1, wherein the adhering step is a step of dripping the adhesive member on the chamfer formed on each of four sides of a perimeter of the sealing plate to adhere the sealing plate and the substrate.

* * * * *